United States Patent
Hsiao et al.

(10) Patent No.: US 6,670,246 B1
(45) Date of Patent: Dec. 30, 2003

(54) METHOD FOR FORMING A VERTICAL NITRIDE READ-ONLY MEMORY

(75) Inventors: Ching-Nan Hsiao, Kaohsiung (TW); Ying-Cheng Chuang, Bade (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/465,178

(22) Filed: Jun. 19, 2003

(30) Foreign Application Priority Data

Dec. 17, 2002 (TW) ........................................ 91136414 A

(51) Int. Cl.⁷ .................... H01L 21/336; H01L 21/8236
(52) U.S. Cl. ........................ 438/276; 438/266; 438/257; 438/275; 438/259
(58) Field of Search .......................... 438/276, 266, 438/257, 275, 259, 268; 257/374, 330

(56) References Cited

U.S. PATENT DOCUMENTS

| | | | |
|---|---|---|---|
| 5,210,047 A | * | 5/1993 | Woo et al. ................. 438/257 |
| 6,404,020 B1 | * | 6/2002 | Kim ............................. 257/374 |
| 6,432,778 B1 | * | 8/2002 | Lai et al. .................... 438/276 |
| 6,440,798 B1 | * | 8/2002 | Lai et al. .................... 438/266 |
| 6,468,868 B1 | * | 10/2002 | Lee et al. ................... 438/276 |
| 6,486,028 B1 | * | 11/2002 | Chang et al. ............... 438/259 |
| 6,548,861 B2 | * | 4/2003 | Palm et al. ................. 257/330 |
| 6,620,693 B2 | * | 9/2003 | Lai et al. .................... 438/275 |

* cited by examiner

Primary Examiner—Michael S. Lebentritt
(74) Attorney, Agent, or Firm—Nelson A. Quintero

(57) ABSTRACT

A method for forming a vertical nitride read-only memory cell. First, a substrate having at least one trench is provided. Next, a masking layer is formed over the sidewall of the trench. Next, ion implantation is performed on the substrate to respectively form doping areas in the substrate near its surface and the bottom of the substrate trench to serve as bit lines. Next, bit line oxides are formed over each of the doping areas and an oxide layer is formed overlying the mask layer by thermal oxidation. Finally, a conductive layer is formed overlying the bit line oxides and fills in the trench to serve as a word line.

16 Claims, 5 Drawing Sheets

METHOD FOR FORMING A VERTICAL NITRIDE READ-ONLY MEMORY

BACKGROUND OF THE INVENTION

1. Field of the Invention

The present invention relates in general to a method for forming a non-volatile memory cell. More particularly, it relates to a method for forming a vertical nitride read-only memory (NROM) cell to increase performance thereof.

2. Description of the Related Art

The non-volatile memory industry began development of nitride read-only memory (NROM) in 1996. This relatively new non-volatile memory technology utilizes oxide-nitrideoxide (ONO) gate dielectric and known mechanisms of programming and erasing to create two separate bits per cell. Thus, the NROM bit size is half of the cell area. Since silicon die size is the main element in the cost structure, it is apparent that NROM technology is an economic breakthrough.

FIG. 1 is a cross-section showing a conventional NROM cell structure. This cell includes a silicon substrate 100 which has two separated bit lines (source and drain) 102, two bit line oxides 104 formed over each of the bit lines 102, respectively, and an ONO layer 112 having a silicon nitride layer 108 sandwiched between the bottom silicon oxide layer 106 and the top silicon oxide layer 110 formed on the substrate 100 between the bit line oxides 102. A gate conductive layer 114 (word line) lies on the top of the bit line oxides 104 and the ONO layer 112.

The silicon nitride layer 108 in the ONO structure 112 has two chargeable areas 107 and 109 adjacent to the bit lines 102. These areas 107 and 109 are used for storing charges during memory cell programming. To program the left bit close to area 107, left bit line 102 is the drain and receives the high programming voltage. At the same time, right bit line 102 is the source and is grounded. The opposite is true for programming area 109. Moreover, each bit is read in a direction opposite its programming direction. To read the left bit, stored in area 107, left bit line 102 is the source and right bit line 102 is the drain. The opposite is true for reading the right bit, stored in area 109. In addition, the bits are erased in the same direction that they are programmed.

Increasing cell density for integration of ICs requires reducing the bit line area or shrinking the width of the ONO layer. Unfortunately, reducing bit line area may increase the resistance of the bit line, and result in lower operation speed of the memory cell. In addition, shrinking the gate length may induce cell disturbance during programming, erasing, or reading, in particular, when the width of the gate length is less than 10 nm. Therefore, the cell density is limited.

SUMMARY OF THE INVENTION

Accordingly, an object of the present invention is to provide a novel method for forming a vertical nitride read-only memory (NROM) cell, which uses the sidewall of the substrate trench as a channel of the NROM cell, reducing the resistance of bit lines. Moreover, a vertical channel is formed instead of the conventional planar one, thereby preventing the cell disturbance during programming, erasing, and reading.

According to the object of the invention, the invention provides a method for forming a vertical NROM cell. First, a substrate having at least one trench is provided and then a masking layer is formed over the sidewall of the trench. Next, ion implantation is performed on the substrate to respectively form doping areas in the substrate near its surface and the bottom of the substrate trench to serve as bit lines. Next, bit line oxides are formed over each of the doping areas and an oxide layer is formed overlying the mask layer by thermal oxidation. Finally, a conductive layer is formed overlying the bit line oxides and fills in the trench to serve as a word line.

The bit lines can be formed by phosphorus ion implantation. Moreover, the masking layer comprises an oxide layer and an overlying nitride layer. The word line can be polysilicon.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
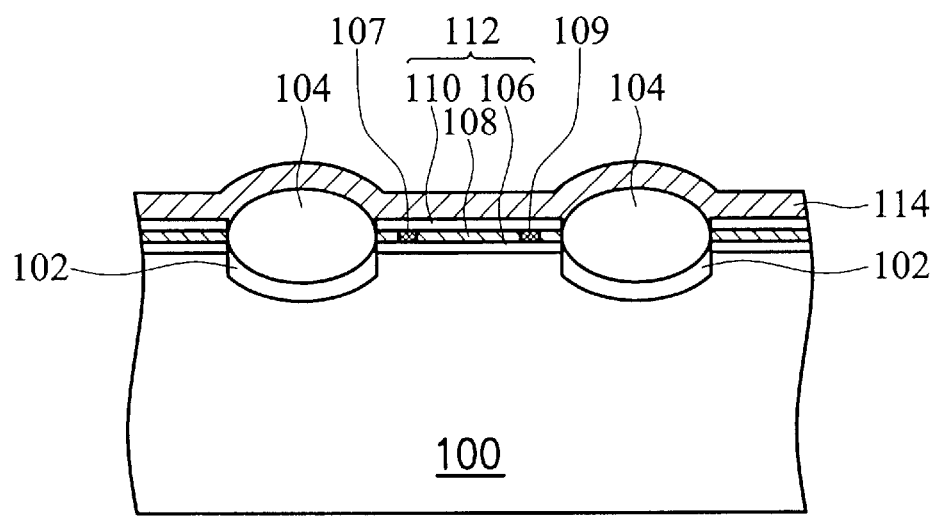
FIG. 1 is a cross-section showing a conventional NROM cell structure.
Figure 2A:
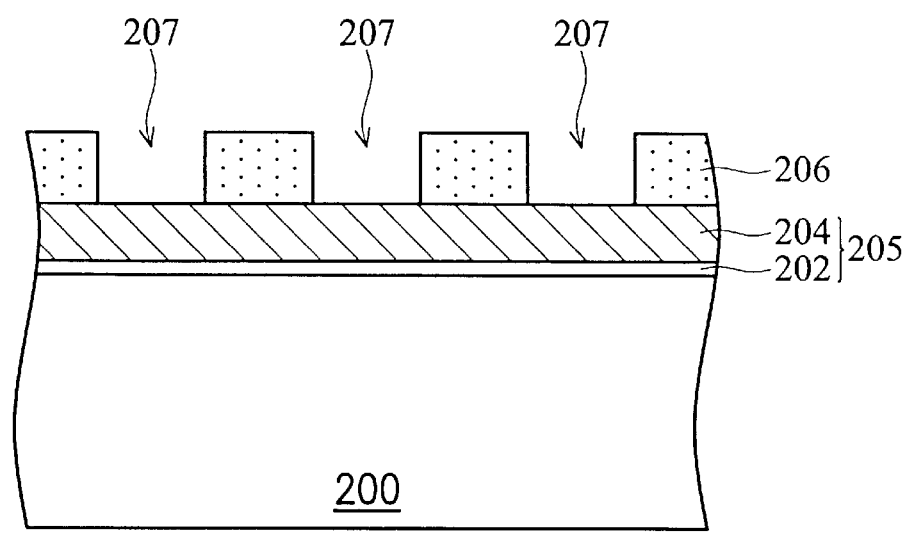
FIGS. 2a to 2f are cross-sections showing a method flow for forming a vertical NROM cell according to the present invention.

A preferred embodiment of the present invention is now described with reference to FIGS. 2a to 2f and FIG. 3. First, in FIG. 2a, a substrate 200, such as a silicon wafer, is provided. A mask layer 205 is formed on the substrate 200. As shown in FIG. 2a, the mask layer 205 can be composed of a pad oxide layer 202 and a thicker overlying silicon nitride layer 204. In this invention, the pad oxide layer 202 can be formed by thermal oxidation or conventional CVD, such as atmospheric pressure CVD (APCVD) or low pressure CVD (LPCVD). Moreover, the silicon nitride layer 204 overlying the pad oxide layer 202 can be formed by LPCVD using $SiCl_2H_2$ and $NH_3$ as a reaction source.

Next, a photoresist layer 206 is coated on the mask layer 205, and then the photoresist layer 206 is patterned by lithography to form a plurality of openings 207 therein.

Figure 2B:
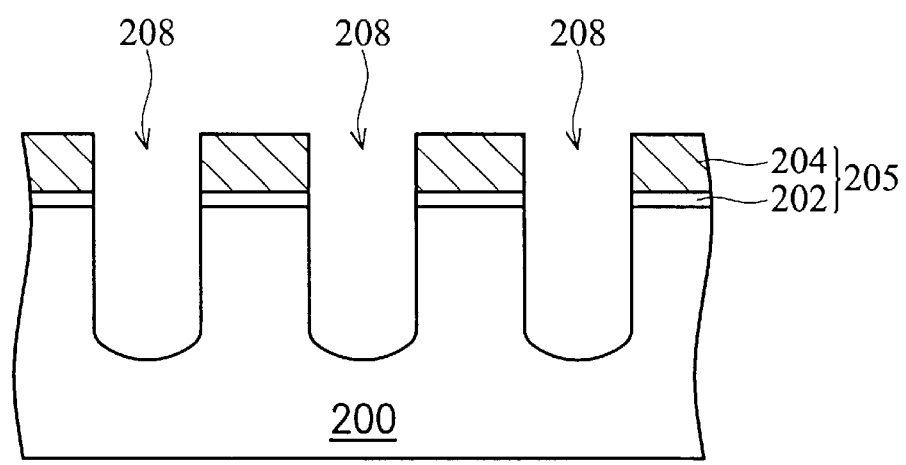

Next, in FIG. 2b, the mask layer 205 is anisotropically etched, for example, reactive ion etching (RIE), using the patterned photoresist layer 206 as an etch mask to transfer the opening patterns 207 to the mask layer 205. Thereafter, the photoresist layer 206 is removed by suitable wet etching or ashing.

Subsequently, anisotropic etching, for example, RIE, is performed using the mask layer 205 as an etch mask. The silicon substrate 200 under these openings is etched to a predetermined depth, such as 1400~1600 Å, to form a plurality of trenches 208 in the silicon substrate 200.

Figure 2C:
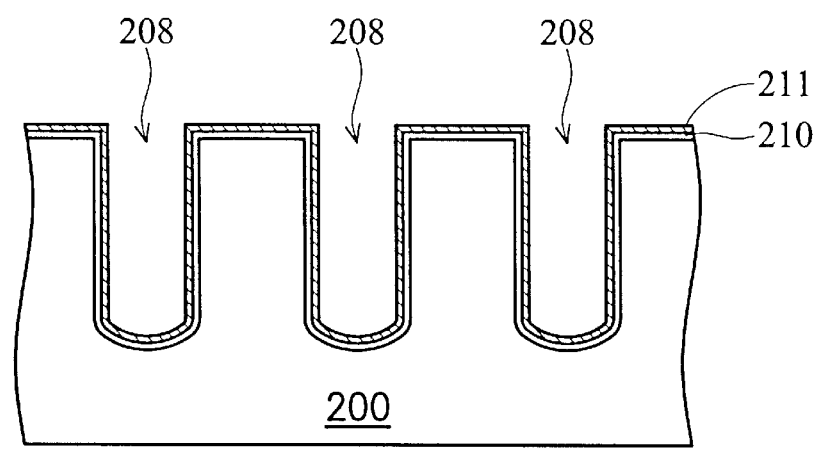

Next, in FIG. 2c, the mask layer 205 is removed. The method of removing the silicon nitride layer 204, can, for example use soaking with hot $H_3PO_4$, and the method of removing pad oxide layer 202 can, for example, be soaking with HF liquid.

Thereafter, a conformable silicon oxide layer 210, which has a thickness of about 30~100 Å, is formed overlying the substrate 200 and the surface of the trenches 208 by thermal oxidation or CVD. The thin oxide layer 210 is used for repairing defects (not shown) formed in the substrate 200 during etching the trenches 208. Next, a conformable silicon nitride layer 211 is deposited overlying the silicon oxide layer 210 by, for example, LPCVD and has a thickness of about 30~100 Å.

Figure 2D:
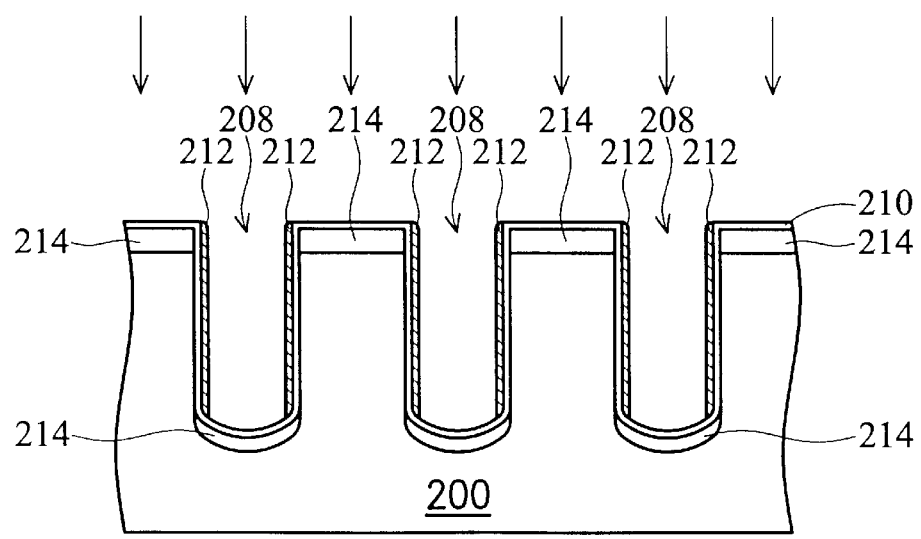

Next, in FIG. 2d, anisotropic etching, such as RIE, is performed on the silicon nitride layer 211 to form a spacer 212 over the sidewall of each trench 208. Thereafter, phosphorus ion implantation is performed on the surface of the substrate 200 and in the bottom of the substrate trenches 208 using the spacers 212 as masks, thereby forming doping areas 214 in the substrate 200 near its surface and the bottom of the trenches 208 to serve as bit lines.

Figure 2E:
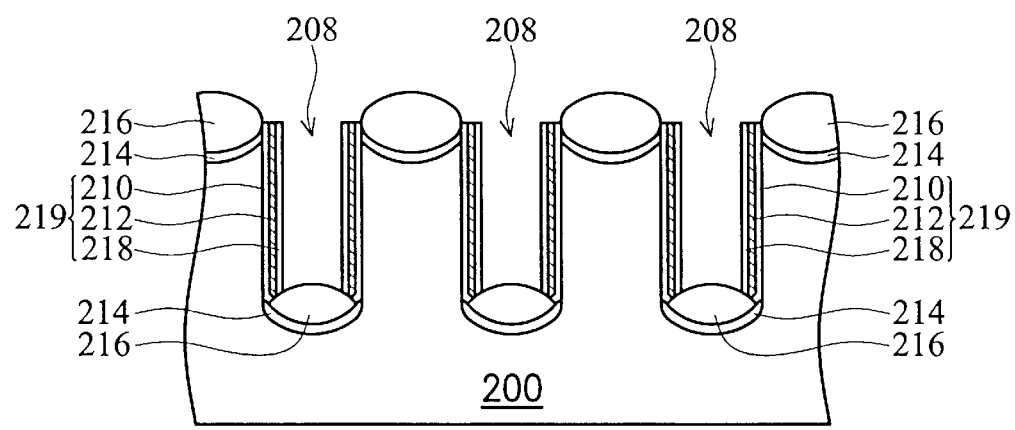

Next, in FIG. 2e, bit line oxides 216 are formed over each of the doping areas 214 by thermal oxidation or other deposition and a thin silicon oxide layer 218 is simultaneously formed on the surface of the spacer 212. The bit line oxides 216 are usually very thick, for example, about 500~700 Å, thereby lowering the bit line capacitance. The silicon oxide layer 210, the spacer 212 formed by silicon nitride, and the silicon oxide layer 218 create an oxide-nitride-oxide (ONO) layer 219 to serve as a gate dielectric layer.

Thereafter, a conformable silicon layer (not shown) can optionally be formed on the silicon oxide layer 218 by CVD to increase the thickness of the silicon oxide layer 218. Here, the silicon oxide layer 218 has a thickness of about 30~100 Å. In this invention, the ONO layer 219 is used for storing charges during memory cell programming. The charge storing regions (not shown) are in the silicon nitride layer 212 of the ONO layer 219 and near the doping areas 214. Unlike the prior art, in the invention, the substrate 200 of the sidewall of the trenches 208 serves as a vertical channel for a memory cell. That is, a vertical channel can be formed according to the invention instead of the conventional planar channel.

Figure 2F:
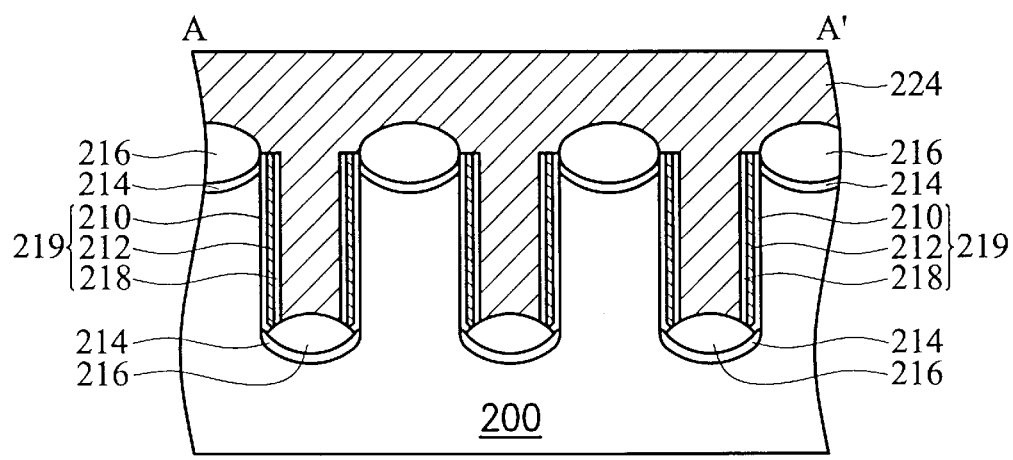
Figure 3:
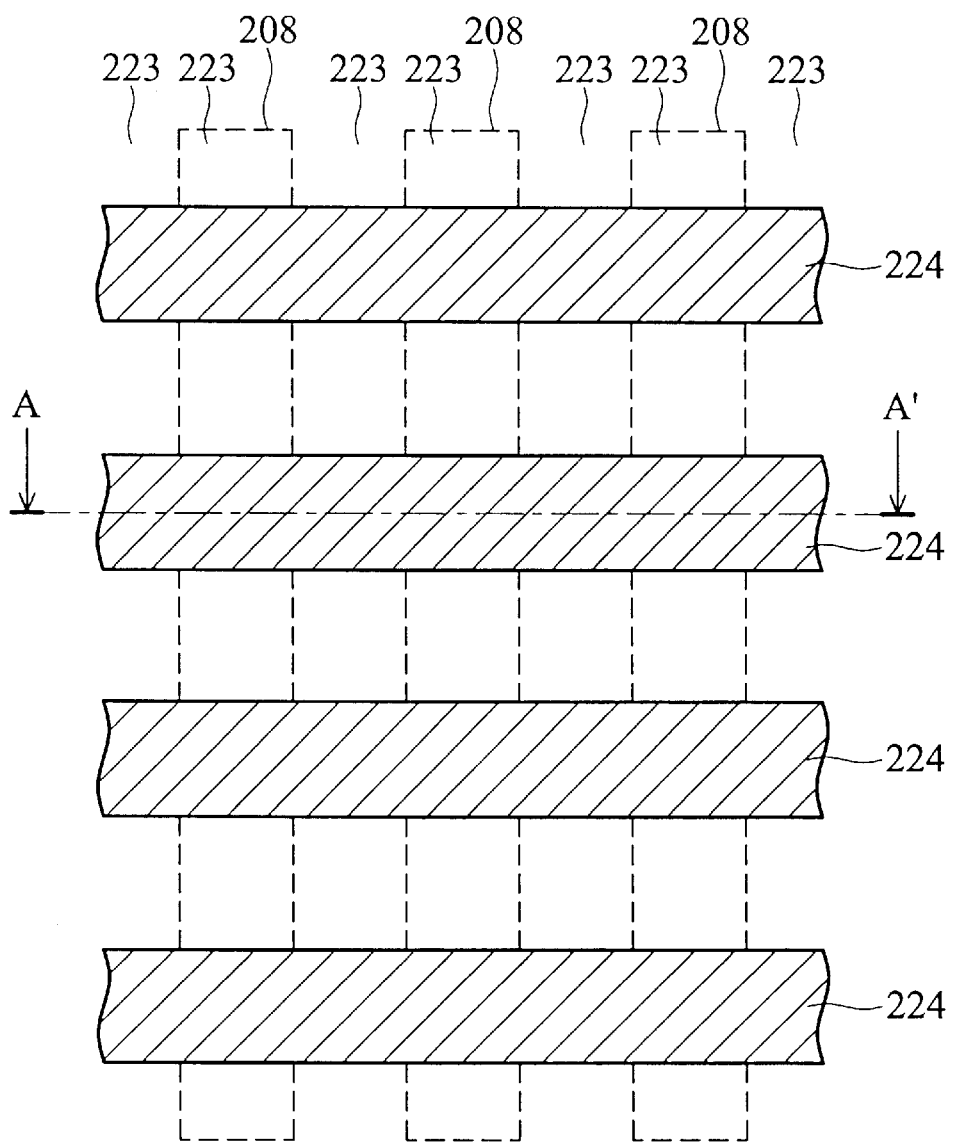
FIG. 3 is a plane view of the vertical NROM cell according to the present invention.

Finally, in FIG. 2f, a conductive layer 224, such as polysilicon, is formed overlying the insulating layer 223 and fills in the trenches 208. The conductive layer 224 can be formed by CVD and has a thickness of about 1500~2000 Å. Thereafter, the conductive layer 224 is planarized by chemical mechanical polishing (CMP). Next, a photoresist layer (not shown) is coated on the conductive layer 224. Lithography and etching are successively performed on the conductive layer 224, thereby defining a word line. Thus, the vertical NROM cell according to the invention is completed after the photoresist layer is removed. FIG. 3 illustrates a plane view of the vertical NROM cell in FIG. 2f.

Compared with the prior art, the NROM cell of the invention has a vertical channel with suitable channel length which prevents cell disturbance. That is, the length of the channel is based on the depth of the trench. As long as the depth of the trench is sufficiently deep, cell disturbance is avoided. Moreover, since the channel of the NROM cell is in the sidewall of the substrate trench, the entire plane of the substrate can be used for forming bit lines by ion implantation. That is, the bit line area can be increased to reduce the resistance of the bit line, thereby increasing the operating speed of the NROM. Accordingly, the method for forming an NROM cell according to the invention can increase memory cell performance.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a vertical nitride read-only memory cell, comprising the steps of:

providing a substrate having at least one trench;

forming a masking layer over the sidewall of the trench;

performing ion implantation on the substrate to respectively form doping areas in the substrate near the surface and the bottom of the substrate trench to serve as bit lines;

performing thermal oxidation to form bit line oxides over each of the doping areas and form a first oxide layer overlying the masking layer; and forming a conductive layer overlying the bit line oxides and filling in the trench to serve as a word line.

2. The method as claimed in claim 1, wherein the substrate is a silicon wafer.

3. The method as claimed in claim 1, wherein the trench has a thickness of about 1400~1600 Å.

4. The method as claimed in claim 1, wherein the masking layer comprises an oxide layer and an overlying nitride layer.

5. The method as claimed in claim 4, further comprising forming a conformable second oxide layer overlying the first oxide layer and the bit line oxides.

6. The method as claimed in claim 5, wherein the second oxide layer is formed by chemical vapor deposition.

7. The method as claimed in claim 1, wherein the ion implantation is performed with phosphorus.

8. The method as claimed in claim 7, wherein the bit line oxide has a thickness of about 500~700 Å.

9. The method as claimed in claim 7, wherein the conductive layer is a polysilicon layer.

10. A method for forming a vertical nitride read-only memory cell, comprising the steps of:

providing a substrate having at least one trench;

forming a conformable first oxide layer and a conformable nitride layer overlying the substrate and the surface of the trench in sequence;

anisotropically etching the nitride layer to form a spacer over the sidewall of the trench;

performing ion implantation on the substrate using the spacer as a mask to respectively form doping areas in the substrate near its surface and the bottom of the substrate trench to serve as bit lines;

performing thermal oxidation to form bit line oxides over each of the doping areas and form a second oxide layer overlying the spacer; and forming a polysilicon layer overlying the bit line oxides and filling in the trench to serve as a word line.

11. The method as claimed in claim 10, wherein the substrate is a silicon wafer.

12. The method as claimed in claim 11, wherein the trench has a thickness of about 1400~600 Å.

13. The method as claimed in claim 10, further comprising forming a conformable third oxide layer overlying the second oxide layer and the bit line oxides.

14. The method as claimed in claim 13, wherein the third oxide layer is formed by chemical vapor deposition.

15. The method as claimed in claim 10, wherein the ion implantation is performed by phosphorus.

16. The method as claimed in claim 10, wherein the bit line oxide has a thickness of about 500~700 Å.

* * * * *